United States Patent
Myers et al.

(10) Patent No.: US 8,830,662 B2
(45) Date of Patent: Sep. 9, 2014

(54) ELECTRONIC DEVICES WITH MOISTURE RESISTANT OPENINGS

(75) Inventors: Scott A. Myers, San Francisco, CA (US); Douglas Weber, Arcadia, CA (US); Tang Yew Tan, Palo Alto, CA (US); Richard Hung Minh Dinh, San Jose, CA (US); David A. Pakula, San Francisco, CA (US); Jason Sloey, San Jose, CA (US)

(73) Assignee: Apple Inc., Cupertino, CA (US)

( * ) Notice: Subject to any disclaimer, the term of this patent is extended or adjusted under 35 U.S.C. 154(b) by 508 days.

(21) Appl. No.: 13/037,887

(22) Filed: Mar. 1, 2011

(65) Prior Publication Data

US 2012/0224299 A1    Sep. 6, 2012

(51) Int. Cl.
  *G06F 1/16*    (2006.01)
  *H05K 5/02*    (2006.01)
  *H05K 5/00*    (2006.01)

(52) U.S. Cl.
  CPC ............ *H05K 5/0086* (2013.01); *H05K 5/0213* (2013.01)
  USPC ...................... 361/679.01; 174/521

(58) Field of Classification Search
  USPC .......... 361/679.55–56; 455/575.4; 220/62.11, 220/62.15, 62.22; 174/520, 521
  See application file for complete search history.

(56) References Cited

U.S. PATENT DOCUMENTS

| | | | | |
|---|---|---|---|---|
| 4,298,204 A | * | 11/1981 | Jinkins | 277/641 |
| 4,366,299 A | * | 12/1982 | Dessaint | 526/243 |
| 4,508,376 A | * | 4/1985 | Arnoldt | 285/363 |
| 5,439,998 A | * | 8/1995 | Lina et al. | 526/243 |
| 5,583,742 A | * | 12/1996 | Noda et al. | 361/679.21 |
| 5,703,761 A | * | 12/1997 | Heiss | 361/800 |
| 5,847,876 A | | 12/1998 | Ferrante | |
| 5,882,729 A | * | 3/1999 | Kahl et al. | 427/265 |
| 6,002,884 A | * | 12/1999 | Okumura et al. | 396/25 |
| 6,222,122 B1 | * | 4/2001 | Davidson | 174/554 |
| 6,292,370 B1 | * | 9/2001 | Anderson et al. | 361/748 |
| 6,380,487 B1 | * | 4/2002 | Hollenbeck et al. | 174/135 |
| 6,532,152 B1 | * | 3/2003 | White et al. | 361/692 |
| 6,665,192 B2 | * | 12/2003 | Wimberger Friedl et al. | 361/752 |
| 6,731,913 B2 | * | 5/2004 | Humphreys et al. | 455/90.3 |
| 6,785,566 B1 | * | 8/2004 | Irizarry | 455/575.8 |
| 6,814,359 B2 | * | 11/2004 | Senda et al. | 277/639 |
| 6,822,161 B2 | * | 11/2004 | Komatsu et al. | 174/367 |
| 6,914,774 B1 | * | 7/2005 | Albertini et al. | 361/679.09 |
| 7,158,376 B2 | * | 1/2007 | Richardson et al. | 361/679.56 |

(Continued)

FOREIGN PATENT DOCUMENTS

WO    2005070544    8/2005

OTHER PUBLICATIONS

Alvarez et al. U.S. Appl. No. 12/871,804, filed Aug. 30, 2010.

*Primary Examiner* — Adrian S Wilson
(74) *Attorney, Agent, or Firm* — Treyz Law Group; Jason Tsai

(57) ABSTRACT

Electronic devices may have openings that serve as potential pathways for moisture intrusion into interior portions of the devices. An electronic device may be provided with moisture repelling coatings in the vicinity of these openings to help prevent moisture from reaching the interior of the device. The openings may be associated with gaps between adjacent housing structures, openings for buttons, openings for audio and connector ports or other openings in device structures. The moisture repelling coatings may be applied to housing surfaces, button members, structures associated with audio and connector ports, and other device structures.

17 Claims, 10 Drawing Sheets

(56) References Cited

U.S. PATENT DOCUMENTS

| | | |
|---|---|---|
| 7,214,075 B2 * | 5/2007 | He et al. .................. 439/135 |
| 7,267,847 B2 | 9/2007 | Karamuk |
| 7,525,535 B2 * | 4/2009 | Kim et al. ................. 345/169 |
| 7,563,992 B2 * | 7/2009 | Lawlyes et al. ............. 174/561 |
| 7,590,434 B2 * | 9/2009 | Nogueiras et al. ......... 455/575.1 |
| 7,652,892 B2 * | 1/2010 | Shiu et al. .................. 361/752 |
| 7,677,578 B2 * | 3/2010 | Taguchi ..................... 277/592 |
| 7,733,642 B2 * | 6/2010 | Liou et al. .............. 361/679.41 |
| 7,782,610 B2 * | 8/2010 | Diebel et al. ............ 361/679.56 |
| 7,854,434 B2 * | 12/2010 | Heiman et al. ............... 277/644 |
| 8,071,895 B2 * | 12/2011 | Shiu et al. .................. 174/521 |
| 2001/0038493 A1 * | 11/2001 | Watanabe et al. ............ 359/609 |
| 2002/0079653 A1 * | 6/2002 | Noguchi et al. .............. 277/628 |
| 2002/0149714 A1 * | 10/2002 | Anderson et al. .............. 349/59 |
| 2003/0076460 A1 * | 4/2003 | Murade ....................... 349/111 |
| 2003/0141672 A1 * | 7/2003 | Andou et al. ................. 277/628 |
| 2003/0219117 A1 * | 11/2003 | Sun ............................. 379/441 |
| 2004/0089570 A1 * | 5/2004 | Chien et al. ................... 206/320 |
| 2004/0188120 A1 * | 9/2004 | Komatsu et al. ........... 174/17 CT |
| 2005/0088809 A1 * | 4/2005 | Nakagawa et al. ............ 361/681 |
| 2006/0009100 A1 * | 1/2006 | McGroarty .................... 442/44 |
| 2006/0049585 A1 * | 3/2006 | Isono ........................... 277/637 |
| 2006/0110537 A1 | 5/2006 | Huang |
| 2006/0131819 A1 * | 6/2006 | Kurano et al. ................ 277/628 |
| 2006/0292345 A1 * | 12/2006 | Dave et al. .................... 428/141 |
| 2007/0042193 A1 * | 2/2007 | Wang ........................ 428/423.1 |
| 2007/0045967 A1 * | 3/2007 | Park .............................. 277/534 |
| 2007/0206365 A1 * | 9/2007 | Shiu et al. ..................... 361/752 |
| 2007/0215663 A1 * | 9/2007 | Chongson et al. ............. 224/930 |
| 2007/0235309 A1 * | 10/2007 | Tsu ............................... 200/515 |
| 2007/0236465 A1 * | 10/2007 | Chou et al. .................... 345/173 |
| 2007/0279859 A1 * | 12/2007 | Canova et al. ................ 361/683 |
| 2007/0290402 A1 * | 12/2007 | Edwards ....................... 264/259 |
| 2008/0094786 A1 * | 4/2008 | Liou et al. ..................... 361/679 |
| 2008/0133832 A1 * | 6/2008 | Bhavnani ...................... 711/115 |
| 2008/0170357 A1 * | 7/2008 | Hsu ............................... 361/681 |
| 2009/0014965 A1 * | 1/2009 | Kudo et al. .................... 277/591 |
| 2009/0141436 A1 * | 6/2009 | Matsuoka et al. ........ 361/679.09 |
| 2009/0191374 A1 | 7/2009 | D'Urso |
| 2009/0263641 A1 * | 10/2009 | Martin et al. .................. 428/221 |
| 2009/0291709 A1 * | 11/2009 | Lee et al. ..................... 455/556.2 |
| 2009/0296357 A1 | 12/2009 | Pitkonen et al. |
| 2010/0045911 A1 | 2/2010 | Hiraide |
| 2010/0127856 A1 * | 5/2010 | Sipple .......................... 340/540 |
| 2010/0206601 A1 * | 8/2010 | Choraku et al. .............. 174/50.5 |
| 2010/0214732 A1 * | 8/2010 | Charles et al. ............ 361/679.33 |
| 2010/0230155 A1 * | 9/2010 | Hashizume et al. .......... 174/521 |
| 2010/0296028 A1 | 11/2010 | Nakai |
| 2011/0051348 A1 * | 3/2011 | Song ........................ 361/679.26 |
| 2012/0051007 A1 * | 3/2012 | Alvarez et al. ................ 361/752 |

* cited by examiner

ELECTRONIC DEVICES WITH MOISTURE RESISTANT OPENINGS

BACKGROUND

This relates generally to electronic devices, and, more particularly, to controlling moisture intrusion into the interior of electronic devices.

Electronic devices are often exposed to moist environments. As an example, a user may operate a cellular telephone or media player outdoors when there is precipitation. Devices may also be exposed to moisture in the form of user perspiration.

Devices with watertight housings are able to prevent sensitive internal components from being exposed to moisture. Waterproof housings are, however, often impractical for normal use.

Devices without watertight housings are vulnerable to moisture-induced damage. Moisture may enter a device housing through an opening that is associated with a connector port or a button. Moisture may also enter a device housing through housing seams. If sufficient moisture intrudes into the interior of an electronic device, integrated circuits, switches, and other electronic components may be damaged.

It would therefore be desirable to be able to provide electronic devices with improved resistance to the intrusion of moisture.

SUMMARY

Electronic devices may be provided with moisture repelling coatings to help prevent moisture from intruding into sensitive areas. Moisture repelling coatings may be used, for example, to prevent moisture from entering the interior of an electronic device through gaps in an electronic device housing, housing openings associated with device ports, holes in a device that are associated with buttons, and other openings.

Gaps may be formed along the seams between mating housing members or may arise at the interface between a display and the housing structures to which the display is mounted. Gap-shaped openings may also arise between other housing structures. To help prevent moisture from wicking along the surfaces of the gap, a moisture repelling coating may be deposited on the gap surfaces. The moisture repelling coating may cause moisture to bead, thereby helping to prevent wicking action and moisture intrusion.

Moisture repelling coatings may also be formed in device openings that are associated with device ports. Audio ports such as microphone and speaker ports may be covered with a mesh. To help prevent moisture intrusion, the mesh may be coated with moisture repelling coating. Structures associated with connector ports such as audio jacks, data connector ports, and other ports may also be provided with moisture repelling coatings.

Buttons and other movable parts may be formed in openings in device housings. To help prevent moisture intrusion, button structures and housing members may be coated with moisture repelling material in the vicinity of the openings.

Further features of the invention, its nature and various advantages will be more apparent from the accompanying drawings and the following detailed description of the preferred embodiments.

DETAILED DESCRIPTION

Electronic devices may have gaps along housing seams, button openings, openings for audio and connector ports, and other openings that may allow moisture to intrude into device interiors. The moisture may damage electrical components. To help prevent moisture intrusion, the surfaces associated with the openings in an electronic device may be coated with a moisture repelling material. The moisture repelling material on the surface of a device structure may cause moisture to bead into droplets and resist movement through the opening towards the device interior.

Figure 1:
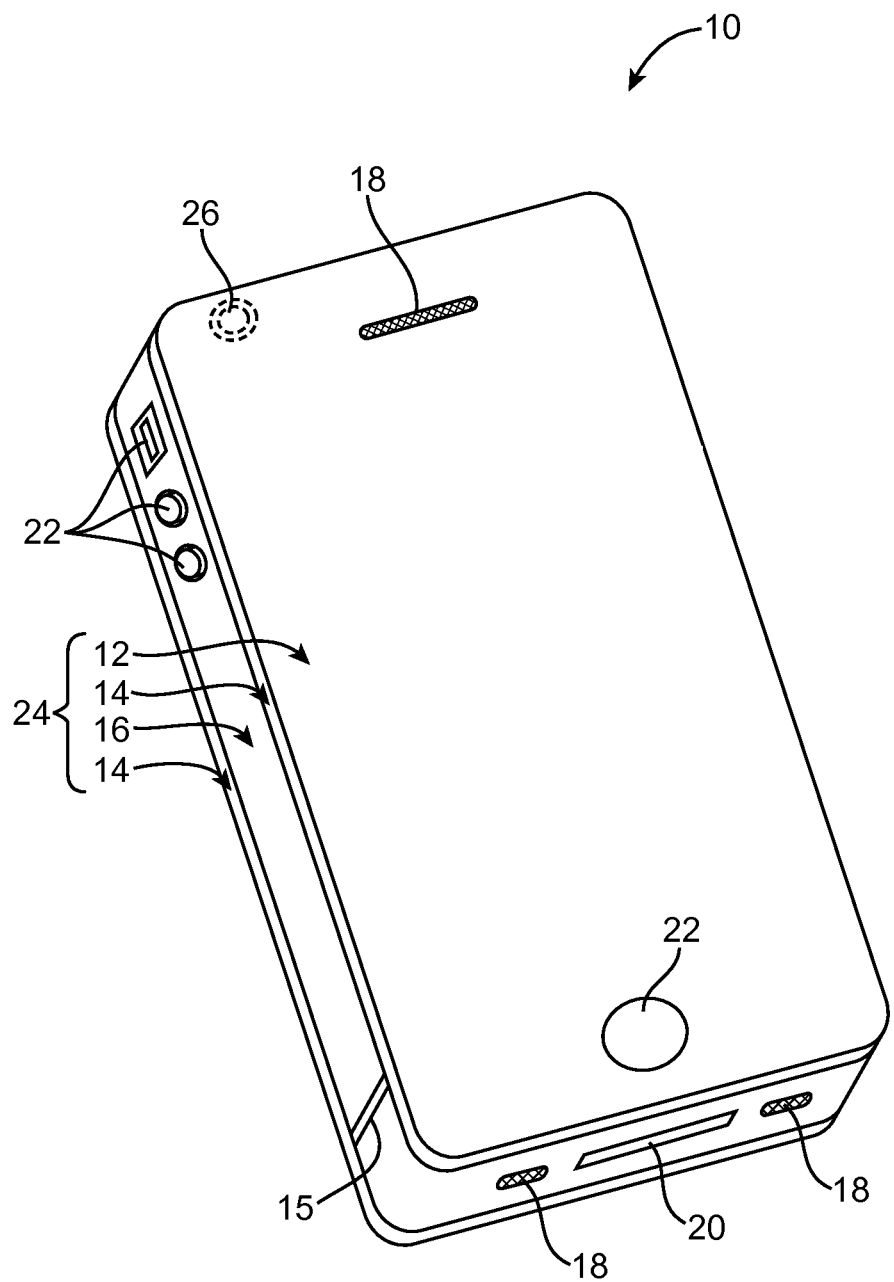
FIG. 1 is a perspective view of an illustrative electronic device of the type that may be provided with moisture repelling coatings to help prevent the intrusion of moisture into the interior of the device in accordance with an embodiment of the present invention.

An electronic device of the type that may be provided with moisture repelling coatings is shown in FIG. 1. Electronic device 10 of FIG. 1 may be a cellular telephone, media player, computer, handheld device, portable computer, tablet computer, Global Positioning System device, camera, gaming device, or other electronic equipment.

As shown in FIG. 1, device 10 may have a housing such as housing 24. Housing 24 maybe formed from plastic, metal, carbon fiber composite material, other composites, glass, ceramics, other materials, or combinations of these materials. Housing 24 may be formed using a unibody construction in which housing 24 is substantially formed from a single structure (e.g., machined or cast metal, plastic, etc.) or may be formed from multiple pieces of material. For example, housing 24 may include front and rear planar housing structures. The front planar housing structure may be a display cover layer for a display such as display 12. The display cover layer may be formed from glass and may sometimes be referred to as cover glass or display cover glass. The display cover layer may also be formed from other transparent materials such as plastic.

Device 10 may be provided with housing structures (sometimes referred to as trim members) that run along the edges of the front and rear planar housing members. A peripheral housing member such as member 16 may have a bezel shape that surrounds display 14 on the front surface of housing 12. In the example of FIG. 1, peripheral housing member 16 forms vertical sidewall structures for device 10. A peripheral housing member in this configuration may sometimes be referred to as a housing band. Peripheral housing member 16 may be formed from a material such as metal (as an example) and may have one or more gaps such as gap 15 that are filled with plastic (as an example). If desired, peripheral housing member 16 may be formed from a single structure that is uninterrupted by gaps as it runs around the edges of the device. Housing structures 12, 14, and 16 may be formed from plastic, metal, carbon fiber composite material, other composites, glass, ceramics, other materials, or combinations of these materials.

Device 10 may have input-output devices such as input-output ports, speakers, microphones, displays, status indicator lights, touch screens, buttons, proximity sensors, wireless circuitry, accelerometers, ambient light sensors, touch pads, and other devices for accepting input from a user or the surrounding environment of device 10 and/or for providing output to a user of device 10.

As shown in the illustrative configuration of FIG. 1, device 10 may, as an example, have one or more buttons 22 which may be used to gather user input. Buttons 22 may be based on dome switches or other switch circuitry. Buttons 22 may include button members that form push buttons (e.g., momentary buttons), slider switches, rocker switches, etc.

Device 10 may have connector ports such as connector port 20 and connector port 26. Connector port 20 may be, for example, a 30-pin connector for a 30-pin data port, a Universal Serial Bus port, or other input-output port. Port 26 may be, for example, an audio jack port configured to receive a mating audio plug. Additional buttons such as buttons 22, additional data ports such as port 20, and additional ports such as audio connector port 26 may be provided in device 10 if desired. The example of FIG. 1 is merely illustrative.

Openings in device 10 may allow moisture to infiltrate into the interior of device 10. Sensitive electronic components may be mounted in the interior of device 10 such as buttons, printed circuit boards, integrated circuits, connectors, sensors, batteries, displays, light-emitting diodes, and other structures. These sensitive electronic components may be damaged by exposure to moisture.

Moisture may intrude into the interior of device 10 through gaps that are formed along the seams in device 10. For example, device 10 may have mating housing members. A gap may form along the seam between the housing members. Gaps may also be formed between components such as display 10, housing sidewalls 16, and trim structures 14.

Figure 2:
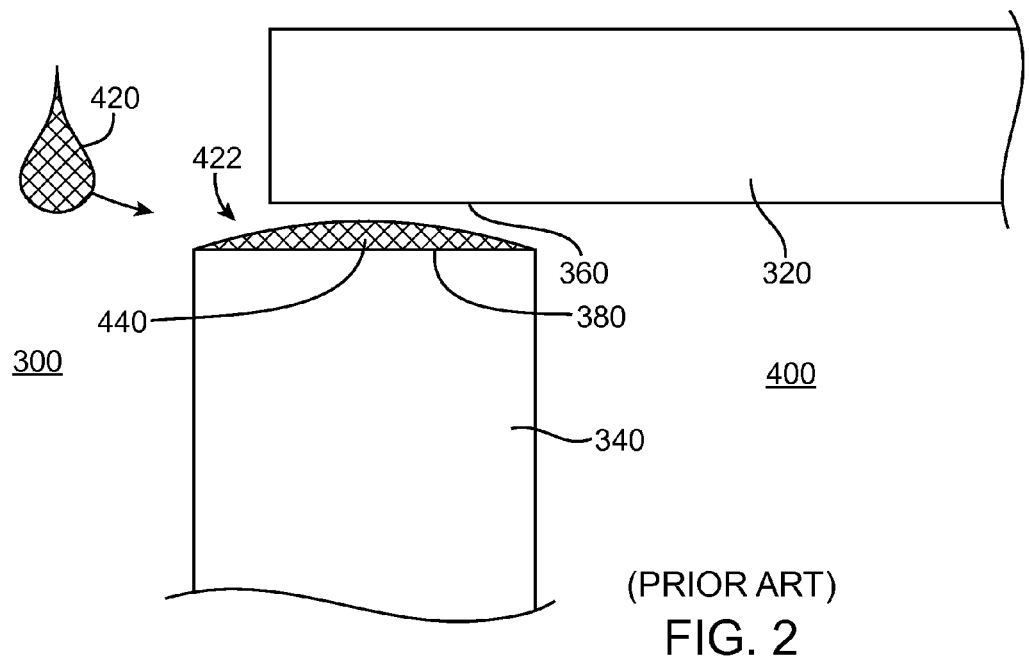
FIG. 2 is a cross-sectional side view of a portion of a conventional electronic device showing how moisture may intrude into the interior of the device through a gap between housing structures.

FIG. 2 is a cross-sectional view of a portion of a conventional electronic device showing how an opening such as gap 422 may exist between opposing surfaces 360 and 380 of respective device structures 320 and 340. Structures 320 and 340 may be associated with the housing of the electronic device and may separate exterior region 300 from device interior 400. In the FIG. 2 scenarios, external moisture droplet 420 is coming into contact with surfaces 360 and 380 of gap 422. As moisture contacts the surfaces of structures 320 and 340, it wets these surfaces and is drawn into the interior of the device. The intrusion of moisture into interior 400 of the device may be exacerbated when the device is used, because use of the device may cause structures 320 and 340 to move slightly with respect to each other, resulting in a pumping action that tends to pull moisture into interior 40.

Figure 3:
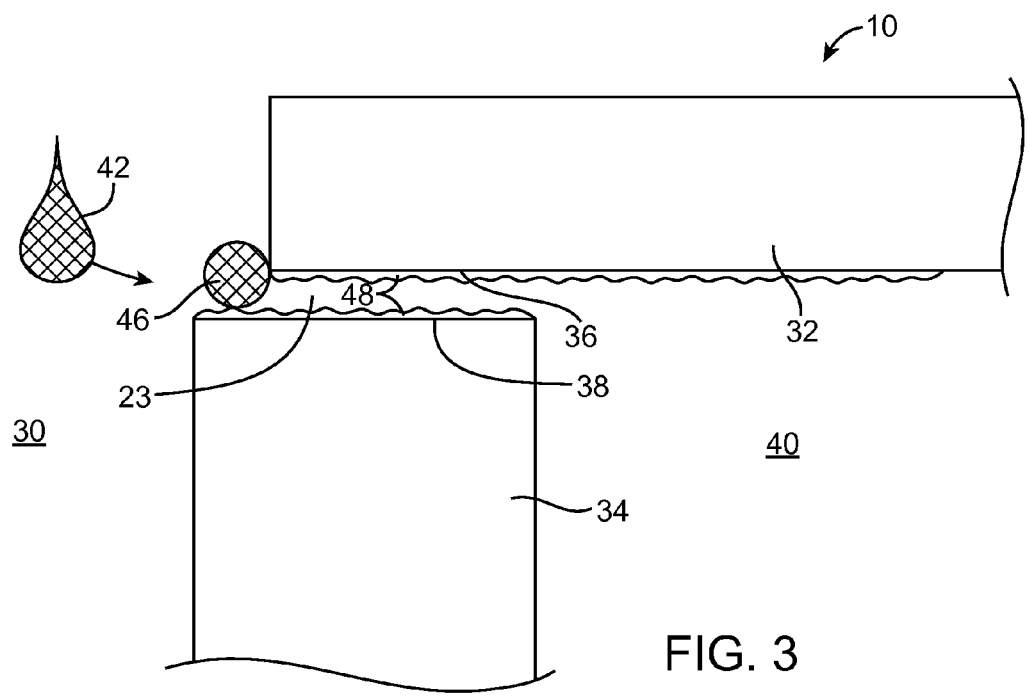
FIG. 3 is cross-sectional side view of a portion of an electronic device showing how surfaces of a gap between housing structures may be coated with a moisture repelling coating to cause moisture to bead into droplets and thereby become less likely to intrude into the interior of the device in accordance with an embodiment of the present invention.

FIG. 3 is a cross-sectional side view of a portion of an electronic device such as device 10 of FIG. 1 showing how device surfaces may be coated with a moisture repelling coating to help prevent moisture intrusion.

In the example of FIG. 3, device 10 has device structures such as structures 32 and 34 that are separated by a gap such as gap 23. Structures 32 and 34 may be housing members such as peripheral housing member 16, a cover glass layer or other display structures, a rear planar housing structure, a trim structure, a bezel, a unitary housing body, or other housing or other portions of device 10. Arrangements in which structures 32 and 34 are formed from housing members such as a housing sidewall member, a display cover glass layer, and a trim member may sometimes be described as an example. This is, however, merely illustrative. Any set of structures in device 10 may be separated by an opening such as gap 23. The arrangement of FIG. 3 is presented as an example.

As shown in FIG. 3, opposing surfaces 36 and 38 of housing members 32 and 34 may be coated with moisture repelling material 48. The presence of moisture repelling material 48 causes external moisture 42 to bead into a beaded droplet 46, significantly reducing the likelihood of moisture ingress from exterior region 30 to device interior 40. Moisture 42 may be water (e.g., from condensation, precipitation, or a spill), a spilled beverage, perspiration, or other liquid. Moisture repelling coating materials that may be used in forming moisture repelling coating layers 48 include parylene, silicone, and polytetrafluoroethylene. With one suitable arrangement, coating 48 is formed from a fluorine-containing coating such as the Hanaryl® 630A coating available from Kanto Kasei Ltd. of Tokyo, Japan.

Materials that repel moisture are sometimes referred to as hydrophobic (water-repelling) coating materials. Coating 48 may exhibit the ability to repel other liquids in addition to water. For example, coating 48 may repel oils and adhesives. Coating materials that repel oils are sometimes referred to as oleophobic materials. Coating 48 may, if desired, exhibit both hydrophobic and oleophobic properties.

Figure 4:
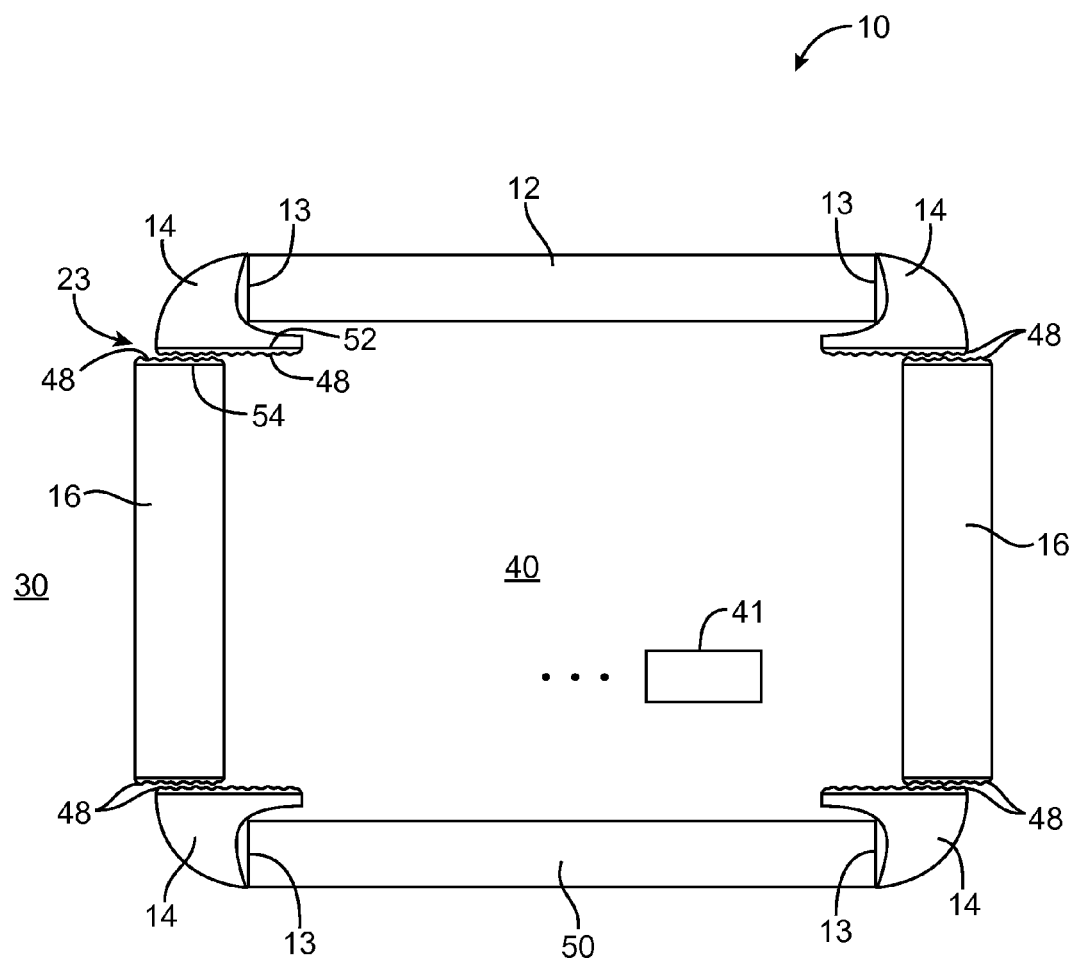
FIG. 4 is cross-sectional end view of an electronic device of the type shown in FIG. 1 showing how moisture repelling coatings may be formed in the gaps between housing structures such as housing sidewalls, a display cover glass, and display mounting structures in accordance with an embodiment of the present invention.

FIG. 4 is a cross-sectional end view of device 10 of FIG. 1 showing how trim structures 14 may be used to surround and cover edges 13 of front planer member 12 and rear planar member 50. Member 12 may be a display cover glass layer associated with a front-facing liquid crystal display (LCD), organic light-emitting display, or other display in device 10. Trim structures 14 may be formed form a material such as glass-filled nylon or other plastic (as an example). Peripheral housing member 16 may be formed from stainless steel or other metal or plastic. Rear planar member 50 may be formed from glass (as an example).

As shown in FIG. 4, housing members 12, 14, and 16 and planar rear member 50 form a housing for device 10, separating exterior region 30 from interior region 40 of device 10. One or more sensitive electronic components such as component 41 may be housed within interior region 40. Gaps such as gap 23 at the joint between opposing housing members 14 and 16 serves as a possible path for moisture intrusion into interior 40. In the arrangement of FIG. 4, opposing surfaces 52 and 54 of mated housing members 14 and 16 in the vicinity of gap 23 are coated in moisture repelling (hydrophobic) material 48. Moisture repelling material 48 reduces the likelihood that moisture will enter gap 23 between housing structures 52 and 54 and reach interior 40 of device 10.

Hydrophobic material 48 may be applied using a robotic x-y table connected to a reservoir of material 48, by submerging device members in a reservoir of material 48, by applying material 48 manually using liquid application tools (e.g., paintbrushes), or using other suitable application methods.

Figure 5:
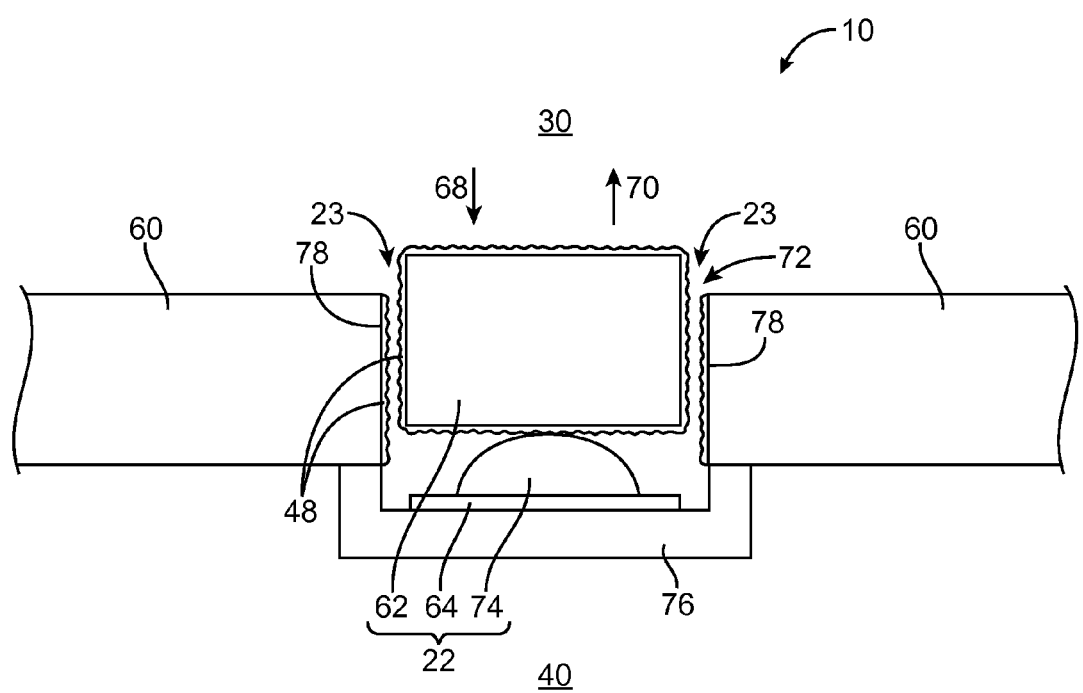
FIG. 5 is cross-sectional side view of a portion of an electronic device having a button that reciprocates in and out of a housing opening showing how button surfaces and surfaces associated with the opening in the housing may be coated with moisture repelling material in accordance with an embodiment of the present invention.

FIG. 5 is a cross-sectional view of a portion of device 10 in the vicinity of one of buttons 22. As shown in FIG. 5, button 22 may have a button member such as button member 62 that reciprocates within opening 72 of housing member 60. Housing member 60 may be a cover glass layer in device 10 (e.g., layer 12), a device sidewall structure such as structure 16 of device 10, planar housing structures, other housing structures, etc. When a user presses the exterior of button member 62 in direction 68, button member 62 may press against a dome switch such as dome switch 74 or other switch mechanism, thereby activating the switch (e.g., shorting internal switch terminals together to close the switch). Dome switches such as dome switch 74 may, if desired, by mounted to printed circuits such as printed circuit 64. Dome switch 74 may have a dome-shaped biasing member that pushes button member 62 outward in direction 70 when the user releases pressure from button member 62. Other types of switches may use spring-based biasing members or other biasing structures to bias button members such as button member 62. The use of a dome switch with a dome-shaped biasing structure is merely illustrative. As shown in FIG. 5, a support bracket such as support bracket 76 may be used to mount dome switch 74 and printed circuit board 64 within device 10.

To allow button member 62 of button 22 to move freely with respect to housing member 60, clearance is provided between the outer surfaces of button member 62 and the opposing inner surface of button-member-shaped hole 72 in housing member 60. This clearance forms gaps or other openings 23. Openings 23 may serve as a possible entrance for moisture into device interior 40. To prevent moisture from reaching sensitive internal components of device 10, moisture repelling coating 48 may be applied to some or all of the surfaces of button member 62 and to appropriate surfaces 78 of member 60. For example, coating 48 may be applied to sidewall portions of button member 62 and opposing inner sidewall surfaces 78 of opening 72 in member 60. Coating 48 may help prevent moisture infiltration into gaps 23. Opening 72 may have a circular shape, may form a rectangular hole, or may have other suitable shapes. Button member 62 may have the shape of a disk or other cylinder, may have a rectangular shape, or may have other suitable shapes.

Switch structure 64 may include a dome switch or other switch mechanism that may fail if exposed to moisture (e.g., short term and/or long term moisture exposure from water or other liquids). Switch structure 64 therefore represents an example of a device component that exhibits sensitivity to moisture. Other moisture-sensitive device components may include integrated circuits, discrete circuit components such as resistors, inductors, and capacitors, display structures, touch sensor circuitry, and sensor circuits (as an example). These sensitive circuits may be vulnerable to moisture exposure due to weather conditions, perspiration, spills of beverages and other liquid, etc.

Figure 6:
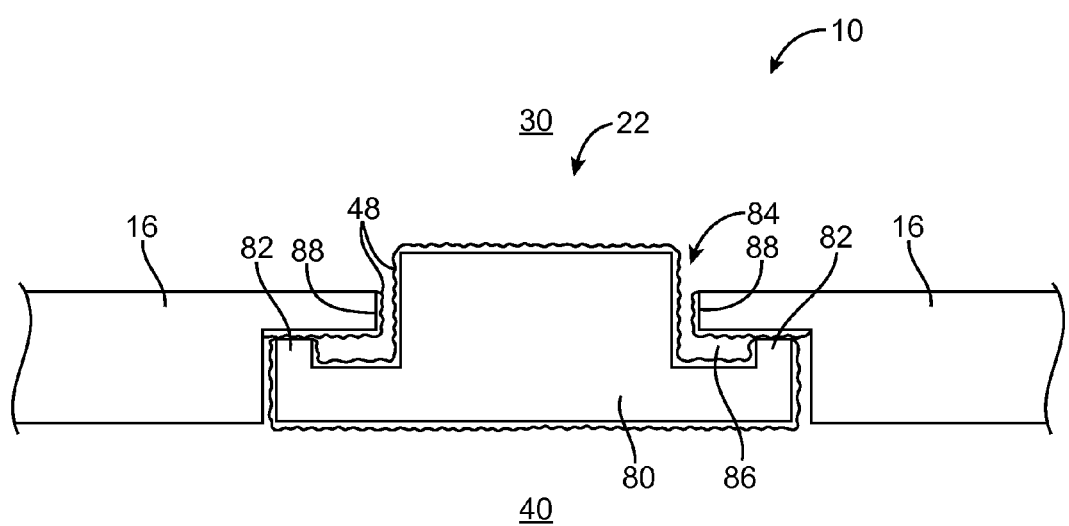
FIG. 6 is cross-sectional side view of a portion of an electronic device in which a sliding button and surfaces associated with an opening in a housing member adjacent to the button may be coated with moisture repelling material in accordance with another embodiment of the present invention.

FIG. 6 is a cross-sectional view of device 10 showing how button 22 may have a button member such as button member 80 with protrusions such as rails (raised portions) 82. Button 22 of FIG. 6 may be a sliding button (e.g., a button of the type shown in the upper left corner of device 10 of FIG. 1). As shown in FIG. 6, button member 80 may be mounted in opening 84 of housing member 16. Raised sections 82 of button member 80 may serve as rails that reduce friction between housing member 16 and button member 80 and therefore facilitate sliding of button member 80 relative to housing member 16. Openings such as gaps 86 may be enlarged due to presence of raised sections 82 of button member 80. Openings 86 therefore may serve as another possible pathway for moisture to intrude from exterior region 30 into interior 40 of device 10.

To prevent moisture from entering opening 86 between housing member 16 and button member 80, hydrophobic coating 48 may be applied to some or all surfaces of button member 80 and may be applied to opposing housing structure surfaces such as surfaces 88 around opening 84 in housing member 16. Moisture repelling coating 48 may cause moisture to bead on the exterior of device 10 rather than wicking into the interior of device 10 via gap 86.

Figure 7:
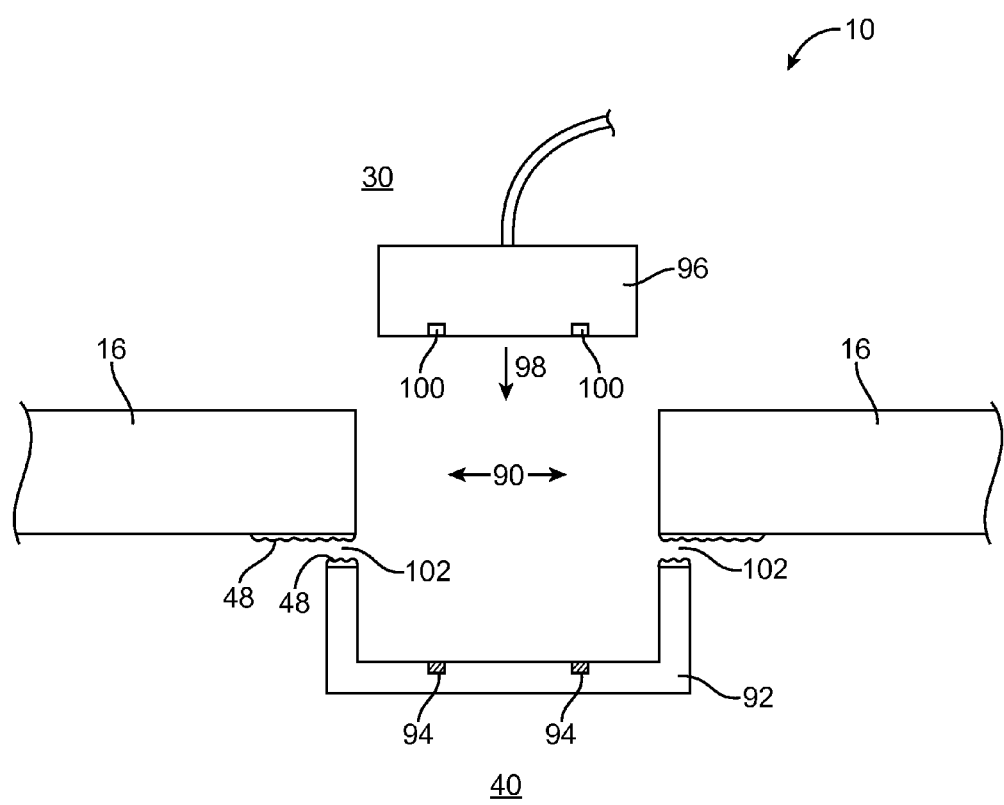
FIG. 7 is a cross-sectional side view of a portion of an electronic device with a connector port showing how a moisture repelling material may be used to help prevent intrusion of moisture through openings into the interior of a device housing in accordance with an embodiment of the present invention.

FIG. 7 shows a cross-sectional view of device 10 in the vicinity of a connector port 20 of FIG. 1. In a connector port arrangement of the type shown in FIG. 7, an opening such as opening 90 in housing member 16 may be provided with a connector structure such as connector structure 92 (e.g. a jack or female connector). Connector structure 92 may include electrical contacts 94. The connector port defined by opening 90 and connector structure 92 may be, for example, a 30-pin connector for a 30-pin data port, a Universal Serial Bus port, or other input-output port. A mating external connector (e.g. a plug or male connector) with electrical contacts 100 may be inserted in direction 98 into opening 90 until contacts 100 mate with contacts 94.

Gaps 102 may be present at the junction between connector structure 92 and the interior surface of housing member 16. This creates a potential path for moisture to travel from exterior 30 to interior 40 of device 10. To minimize the risk of moisture ingress via gap 102, at least the overlapping parts of the abutting surfaces of the mating connector structure 92 and housing member 16 may be coated in a moisture repelling material 48. The presence of moisture repelling coating 48 may encourage moisture to bead within the connector port rather than wicking into the interior of device 10.

Figure 8:
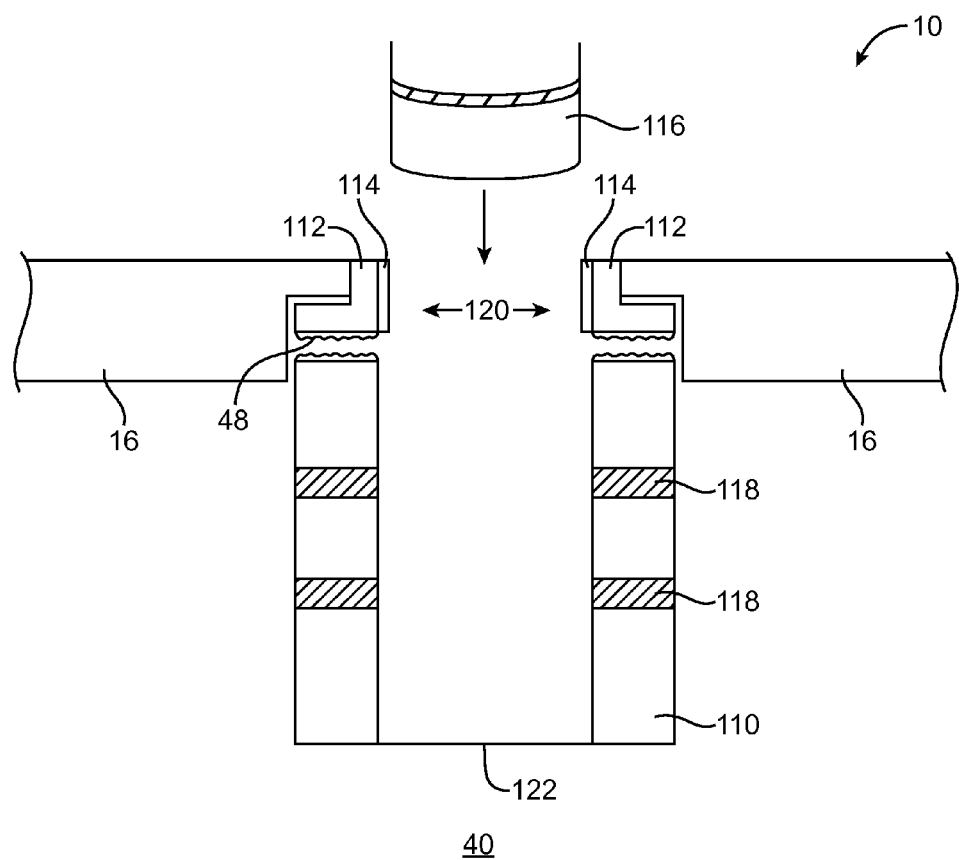
FIG. 8 is a cross-sectional side view of a portion of an electronic device including a connector port such as an audio jack port coated with a moisture repelling material in accordance with an embodiment of the present invention.

FIG. 8 shows a cross-sectional view of device 10 in the vicinity of a connector port such as port 26 of in FIG. 1. As shown in FIG. 8, opening 120 in housing member 16 may be provided with connecting structure 110. Connecting structure 110 may be an audio jack (male connector) that has contacts 118 for mating with connector 116 (e.g., a mating audio plug or other female connector.

A ring such as metal ring 114 or other port entrance lining member may be provided in opening 120. Opening 120 may also be provided with an isolating member 112 such as a black plastic ring that serves to electrically isolate metal ring 114 from housing member 16.

Electrical contacts 118 may be provided along the sides of connector structure 110. In some configurations, connector structure 110 may be at least partly sealed using structure 122. Nevertheless, a path for possible moisture ingress may still exist in the gap at the interface between the mating connector structure 110 and port isolating member 112 and adjacent port lining member 114. To help prevent the entrance of moisture into the interior of device 10, the interior surface of port isolating member 112 and the abutting surface of mating connector structure 110 may be coated with hydrophobic coating 48. Coating 48 may cause external moisture entering the opening defined by port lining member 114 to bead rather than entering the interior of device 10.

Figure 9:
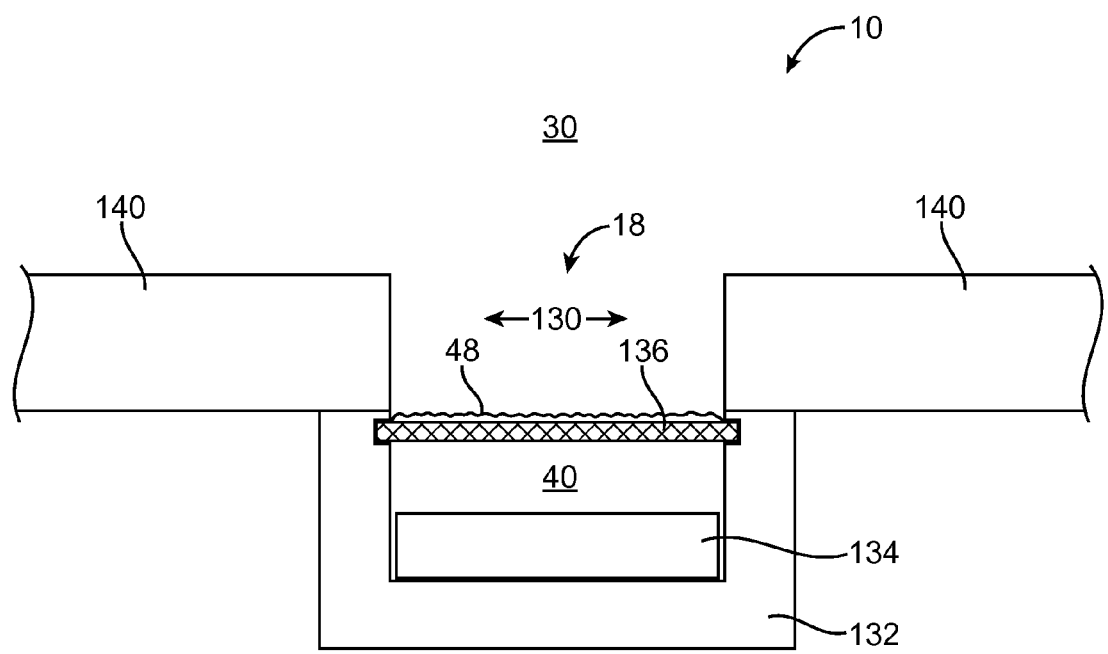
FIG. 9 is a cross-sectional side view of a portion of an electronic device with an audio port showing how audio port mesh structures may be coated with a moisture repelling material to prevent ingress of moisture from the exterior to the interior of the device in accordance with an embodiment of the present invention.

FIG. 9 is a cross-sectional view of a portion of device 10 in the vicinity of an audio port such as one of audio ports 18 of FIG. 1. As shown in FIG. 8, port 18 may be formed from an opening such as opening 130 in housing member 140 (e.g. cover glass 12, peripheral housing member 16, or planar rear housing member 50, or other housing structures). Opening 130 may be aligned with audio component 134. Audio component 134 may be a speaker for providing sound to a user of device 10 or a microphone for receiving input from a user or the external environment. As shown in FIG. 9, audio port 18 may contain an elastomeric mounting structure such as elastomeric structure 132 to support audio component 134. Audio component 134 may be shielded by mesh cover 136. Mesh 136 may have openings that are sufficiently large to allow sound to pass through mesh 136, but sufficiently small to prevent dust and other external objects from reaching audio component 134.

When exposed to moisture, there is a possibility that some of the moisture may penetrate the small openings in the mesh and thereby reach interior 40 of device 10 from exterior region 30. Mesh structure 136 may be made of metal, plastic, carbon fiber composite material, other composites, glass, ceramics, other materials, or combinations of these materials and may have any suitable mesh pattern (e.g., a rectangular grid formed from wires or other filaments, etc.). As shown in FIG. 9, mesh cover 136 (e.g., the wires or other intersecting filaments of the mesh) may be coated with hydrophobic coating layer 48. This may encourage moisture to bead on the external side of mesh 48 rather than penetrating the holes in mesh 48, entering interior 40 of device 10, and potentially damaging sensitive interior components such as audio component 134.

Figure 10:
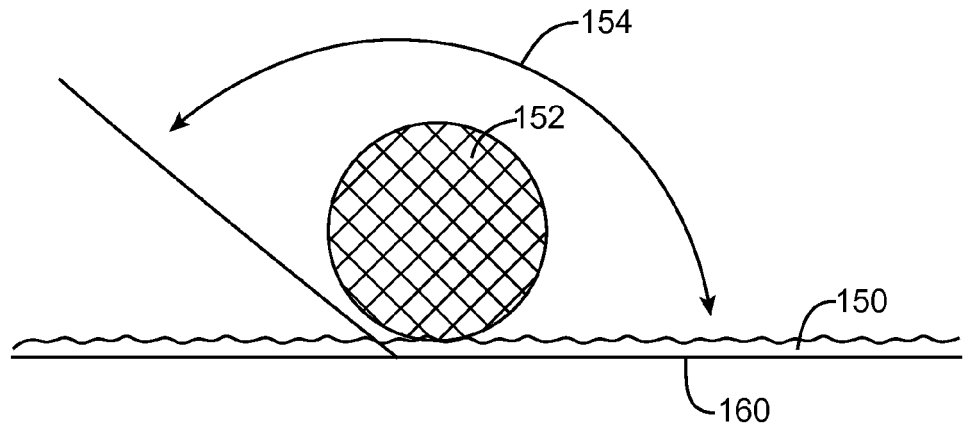
FIG. 10 is a cross-sectional side view of a moisture droplet beaded due to the presence of a moisture repellant coating on a surface. The large contact angle of the desired beaded droplet, a standard for determining water repellency is shown.
Figure 11:
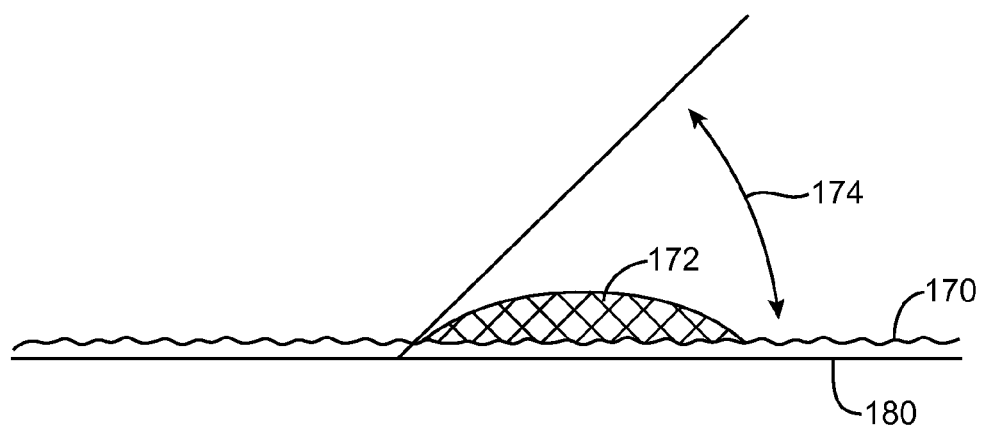
FIG. 11 is a cross-sectional side view of a moisture droplet adhering to, also commonly referred to as wetting, a surface in the absence of moisture repellant material.

FIG. 10 and FIG. 11, respectively, depict desirable and undesirable properties for a moisture repelling material. In the arrangement of FIG. 10, moisture repelling material 150 coats surface 160 and causes moisture 152 to bead on the surface. The resulting beaded shape for moisture 152 is characterized by a large contact angle such as angle 154 with surface 160. Contact angle 154 for coating 150 (and hydrophobic coating 48) is preferably at least 90° or more. A large contact angle is consistent with a difficult entrance of a beaded moisture droplet such as droplet 152 into small gaps in or between surfaces. Coating 48 may be formed from a fluorine-based coating such as the Hanaryl® 630A coating available from Kanto Kasei Ltd. of Tokyo, Japan. This coating exhibits satisfactory wear resistance, is water insoluble, and adheres well to a variety of surfaces such as stainless steel, glass-filled nylon and other plastics, glass, etc.

FIG. 11 shows an ineffective coating arrangement. In the example of FIG. 11, coating material 170 does not cause moisture 172 to bead on surface 180 and is characterized by a relatively small contact angle 174. Coating 170 of FIG. 11 may allow moisture to enter a thin gap in or between surfaces. Situations in which there is no coating 170 on surface 180 may likewise be characterized by small contact angles.

Figure 12:
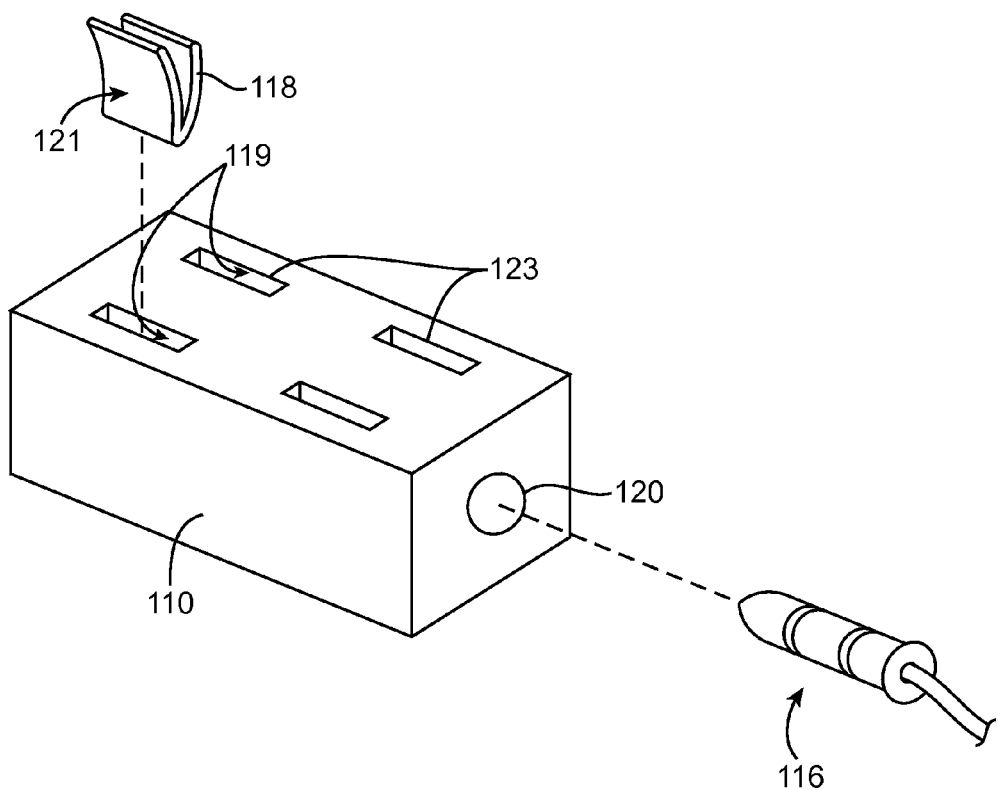
FIG. 12 is a perspective view of an illustrative audio jack connector that has structures such as a body structure and spring contact structure coated with moisture repelling coatings in accordance with an embodiment of the present invention.

FIG. 12 is a perspective view of an illustrative audio jack connector of the type that may be provided with moisture repelling coatings to help prevent moisture from infiltrating the interior of device 10. As shown in FIG. 12, connector structure 110 may have openings such as openings 123 that receive mating spring structures such as spring structure 118. Spring structures 118 may be used in forming electrical contacts for the audio jack connector (see, e.g., contacts 118 of FIG. 8). To help block moisture, surfaces such as spring surface 121 and opening surfaces 119 of openings 123 may be coated with moisture repelling coatings (e.g., before springs 118 are inserted into openings 123 during assembly of the audio jack connector). Connector structure 110 may be formed from plastic or other suitable materials. Springs 118 may be formed from spring metal or other suitable conductors. If desired, other conductive structure and connector parts may be coated with moisture repelling coating 48. The example of FIG. 12, which illustrates how moisture repelling coatings may be used in the context of an electrical contact is merely illustrative.

The foregoing is merely illustrative of the principles of this invention and various modifications can be made by those skilled in the art without departing from the scope and spirit of the invention. The foregoing embodiments may be implemented individually or in any combination.

What is claimed is:

1. An electronic device, comprising:
   a housing that separates an interior region of the electronic device from an exterior region, wherein the housing has at least first and second housing members, wherein the first and second housing members have respective opposing first and second surfaces;
   a first moisture repelling coating layer on the first surface; and
   a second moisture repelling coating layer on the second surface, wherein the first and second moisture repelling coating layers are separated by a gap that extends along an overlapping portion of the first and second surfaces.

2. The electronic device defined in claim 1 wherein the first housing member comprises a housing sidewall member.

3. The electronic device defined in claim 2 further comprising a display cover layer with a peripheral edge, wherein the second housing member comprises a trim structure that runs along the peripheral edge.

4. The electronic device defined in claim 1 wherein the first housing member comprises a display cover layer.

5. The electronic device defined in claim 1 wherein the first housing member comprises metal and wherein the second housing member comprises plastic.

6. The electronic device defined in claim 5 wherein the first housing member comprise a peripheral housing member that forms sidewalls for the electronic device and wherein the plastic comprises glass-filled plastic.

7. The electronic device defined in claim 1 wherein the first and second moisture repelling coating layers comprise fluorine.

8. An electronic device, comprising:
   a display cover layer having a peripheral edge;

a housing member having a top surface and a bottom surface;

a trim member that runs along the peripheral edge and that is mounted on the top surface of the housing member; and moisture repelling coating formed on the top and bottom surfaces of the housing member.

9. The electronic device defined in claim 8 wherein the housing member comprises metal, wherein the trim member comprises plastic, and wherein the moisture repelling coating comprises fluorine.

10. The electronic device defined in claim 8 wherein the housing member comprises a metal band.

11. The electronic device defined in claim 10 wherein metal band forms a vertical sidewall structure of a device housing that is formed at least in part by the metal band, the trim member and the display cover layer.

12. The electronic device defined in claim 10 wherein the metal band includes a plastic-filled gap.

13. The electronic device defined in claim 8 wherein the moisture repelling coating comprises a hydrophobic material.

14. The electronic device defined in claim 8 wherein the moisture repelling coating comprises an oleophobic material.

15. The electronic device defined in claim 8 wherein the moisture repelling coating comprises a hydrophobic and oleophobic material.

16. The electronic device defined in claim 8, further comprising:

a planar rear housing member having a peripheral edge;

an additional trim member that runs along the peripheral edge of the planar rear housing member, wherein the moisture repelling coating is interposed between the trim member and the top surface of the housing member and between the additional trim member and the bottom surface of the housing member.

17. The electronic device defined in claim 16 wherein the planar rear housing member comprises glass.

\* \* \* \* \*